(12) United States Patent
Yu

(10) Patent No.: US 8,835,322 B2
(45) Date of Patent: Sep. 16, 2014

(54) METHOD FOR REDUCING A MINIMUM LINE WIDTH IN A SPACER-DEFINED DOUBLE PATTERNING PROCESS

(75) Inventor: Liujiang Yu, Shanghai (CN)

(73) Assignee: Shanghai Huali Microelectronics Corporation, Pudong, Shanghai (CN)

(*) Notice: Subject to any disclaimer, the term of this patent is extended or adjusted under 35 U.S.C. 154(b) by 134 days.

(21) Appl. No.: 13/339,559

(22) Filed: Dec. 29, 2011

(65) Prior Publication Data

US 2013/0034962 A1  Feb. 7, 2013

(30) Foreign Application Priority Data

Aug. 4, 2011  (CN) .......................... 2011 1 0222289

(51) Int. Cl.
*H01L 21/311* (2006.01)
*H01L 21/033* (2006.01)

(52) U.S. Cl.
CPC ...... *H01L 21/0337* (2013.01); *H01L 21/31144* (2013.01); *H01L 21/0338* (2013.01)
USPC ............................ 438/696; 438/313; 438/694

(58) Field of Classification Search
USPC .......................................... 438/696, 313, 694
See application file for complete search history.

(56) References Cited

U.S. PATENT DOCUMENTS

2008/0008969 A1* 1/2008 Zhou et al. ..................... 430/313
2009/0130852 A1* 5/2009 Kewley ......................... 438/694

* cited by examiner

*Primary Examiner* — Michael Cleveland
*Assistant Examiner* — Mahmoud Dahimene
(74) *Attorney, Agent, or Firm* — McDonnell Boehnen Hulbert & Berghoff LLP

(57) ABSTRACT

The invention discloses a method for reducing a minimum line width in a spacer-defined double patterning process of the present invention. In the method, the silicon nitride spacers can be converted into trenches in the interlayer dielectric layer by using a silicon dioxide film as a mask and by means of a chemically mechanical polishing process and an etching process, so that the minimum line width of the trenches can be determined by the width of the silicon nitride spacers, and thus a smaller line width can be achieved and the process can be simple and easy to control.

10 Claims, 19 Drawing Sheets

METHOD FOR REDUCING A MINIMUM LINE WIDTH IN A SPACER-DEFINED DOUBLE PATTERNING PROCESS

CROSS REFERENCE TO THE RELATED APPLICATIONS

This application is based upon and claims the benefit of priority from the prior Chinese Patent Application No. 201110222289.8 filed on Aug. 4, 2011, entitled "A Method for Reducing A Minimum Line Width in A Spacer-defined Double Patterning Process" with Chinese State Intellectual Property Office, under 35 U.S.C. §119. The contents of the above prior Chinese Patent Application are incorporated herein by reference in its entirety.

TECHNICAL FIELD

The present invention relates to the technical field of semiconductor preparation, and more particularly to a method for reducing a minimum line width in a spacer-defined (sidewall-defined) double patterning process.

BACKGROUND

In the existing preparation process of semiconductor devices, chips are processed in batch, and a large number of complicated devices are formed in one and the same wafer. Recently, with rapid development of the very large scale integration (VLSI), the chips are developed toward high integration density and miniaturization. In the preparation process, the critical dimensions (CD) of chip are further reduced as well, which raises a higher requirement to a lithography process. However, due to the restriction by the light source wavelength of scanner, the existing immersion scanner with 193-nanometer (nm) wavelength cannot meet requirements of a process below 32 nm. In order to satisfy the requirements of the process below 32 nm, methods mainly used in practice are double patterning technique and extreme ultraviolet (EUV) Lithography technique.

Among these techniques, the lithography technique with spacer-defined double patterning is one of the double patterning techniques. The spacer-defined double patterning has been widely used in preparation processes of trench structures, for example, in pattern definition of the trench structures such as a trench structure in an active region, a metal trench structure, etc. As shown in FIGS. 1A to 1H, by taking the metal trench structure as an example, the above-mentioned spacer-defined double patterning process applies into the preparation process of trench structure mainly by the following processes: first, depositing in sequence a lower layer medium 12, an interlayer dielectric layer (inter metal dielectric) 13 and a sacrificial hard mask layer 14 on a substrate 11, so as to form a trench structure in the interlayer dielectric layer 13, in which the trench will eventually stop on the lower layer medium 12; next, coating a layer of photoresist 15 on the sacrificial hard mask layer 14 (as shown in FIG. 1B), and performing a lithography process (exposure, development) so as to form photoresist retention structures 15a, 15b (as shown in FIG. 1C); and then etching the sacrificial hard mask layer 14 by using the photoresist retention structures 15a, 15b as masks to form retention structures 14a, 14b of the sacrificial hard mask layer, and removing the photoresist retention structures 15a, 15b (as shown in FIG. 1D); next, depositing a layer of silicon nitride film 16 for forming a spacer on the retention structures 14a, 14b of the hard mask layer (as shown in FIG. 1E), etching the silicon nitride film 16 with an anisotropic dry etching process to form spacers 16a, 16b, 16c and 16d on both sides of the retention structures 14a, 14b of the sacrificial hard mask layer respectively (as shown in FIG. 1F), and then removing the retention structures 14a, 14b of the sacrificial hard mask layer (as shown in FIG. 1G) and performing a loop trimming exposure, and etching the interlayer dielectric layer 13 by using the silicon nitride spacers 16a, 16b, 16c and 16d and the loop trimming photoresist 17 as masks to form desired lithography patterns of trench (as shown in FIG. 1H); and eventually, removing the silicon nitride spacer masks and the loop trimming photoresist 17 to form the final pattern of the metal trench (as shown in FIG. 1I). As spacers are located on both sides of the retention structures of the sacrificial hard mask layer after the formation of the spacers, the pattern density of the spacers would be twice of the pattern density originally formed from the photoresist, and the pitch of the lithography pattern would be reduced to one half of the original pitch correspondingly, so that smaller critical dimensions can be obtained.

In the process of lithography pattern definition of trenches by means of spacer-defined double patterning technique, a minimum line width of the retention structure of the sacrificial hard mask layer (see "b" in FIG. 1D) is determined by the lithography process (see "a" in FIG. 1C), so that the minimum width "c" of the trench in the final pattern (as shown in FIG. 1I) is also determined by the lithography process. Moreover, the minimum width that can be exposed by the photoresist is in turn determined by the factors such as the light source wavelength and the thickness of the photoresist and so on. In the case where the conditions such as the light source wavelength and the thickness of the photoresist are determined, the minimum line width that can be achieved by the lithography process is determined correspondingly.

SUMMARY OF THE INVENTION

The object of the present invention is to provide a method for reducing a minimum line width in a spacer-defined double patterning process, by which a smaller line width of the trench can be achieved and the process can be controlled simply and easily.

In order to achieve the above-mentioned object, the invention provides a method for reducing a minimum line width in a spacer-defined double patterning process, comprising the steps of:

step S1: providing a silicon substrate, and depositing in sequence a layer of lower layer medium, an interlayer dielectric layer and a sacrificial hard mask layer on the silicon substrate;

step S2: coating a layer of photoresist on the sacrificial hard mask layer, and performing a lithography process;

step S3: etching the sacrificial hard mask layer by using the photoresist as a mask to form retention structures of the sacrificial hard mask layer, and removing the photoresist;

step S4: depositing a layer of silicon nitride film on the interlayer dielectric layer and the retention structures of the sacrificial hard mask layer, etching the silicon nitride film with a dry etching process to form silicon nitride spacers on both sides of the retention structures of the sacrificial hard mask layer, and then removing the retention structures of the sacrificial hard mask;

step S5: depositing a layer of silicon dioxide film on the interlayer dielectric layer and the silicon nitride spacers;

step S6: performing a planarization process on the silicon dioxide film such that the height of the silicon dioxide film around the silicon nitride spacer corresponds to that of the silicon nitride spacer;

step S7: removing the silicon nitride spacers to form trenches at the positions where the silicon nitride spacers are removed in the silicon dioxide film; and step S8: etching the interlayer dielectric layer by using the silicon dioxide film as a mask and by means of the trenches in the silicon dioxide film, to form desired trenches in the interlayer dielectric layer, and then removing the silicon dioxide film.

In the above-mentioned method, an anisotropic dry etching process may be used to etch the silicon nitride film, in the step S4.

In the above-mentioned method, the planarization process on the silicon dioxide film may be performed with a chemically mechanical polishing method, in the step S6.

In the above-mentioned method, the width of the silicon nitride spacers in the step S4 may be determined by the thickness of the silicon nitride film deposited.

In the above-mentioned method, the minimum line width of the trench in the step S8 may be determined by the width of the silicon nitride spacer formed in the step S4, and thus is determined by the thickness of the silicon nitride film deposited in the step S4.

The method for reducing the minimum line width in a spacer-defined double patterning process according to the invention can convert the silicon nitride spacers into the trenches in the interlayer dielectric layer, by using the silicon dioxide film as a mask and by means of a chemically mechanical polishing process and an etching process, such that the minimum line width of the trench can be determined by the thickness of the silicon nitride film, and thus a smaller line width can be achieved and the process can be simple and easy to control.

DETAILED DESCRIPTION OF THE EMBODIMENTS

Hereinafter, the method for reducing a minimum line width in a spacer-defined double patterning process of the present invention will be further described in detail in conjunction with the appended drawings and specific embodiments.

Figure 1A:
FIGS. 1A to 1I are diagrams of cross-section structure illustrating a spacer-defined double patterning process in the prior art.
Figure 1B:
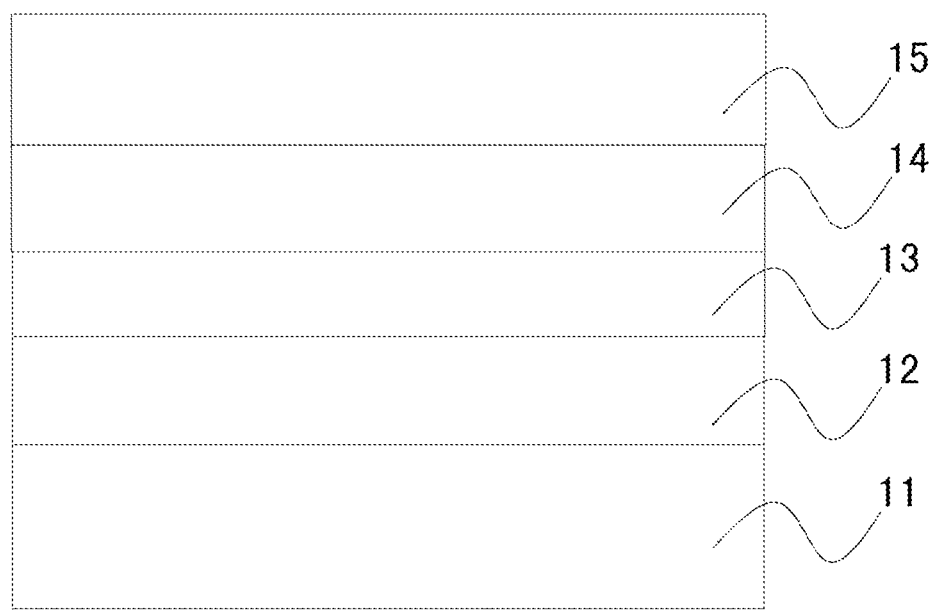
Figure 1C:
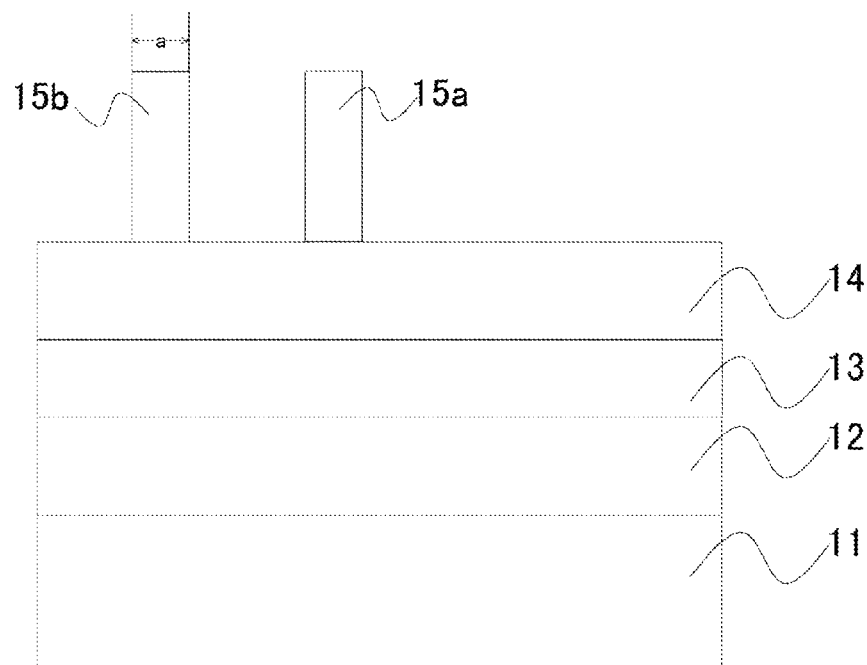
Figure 1D:
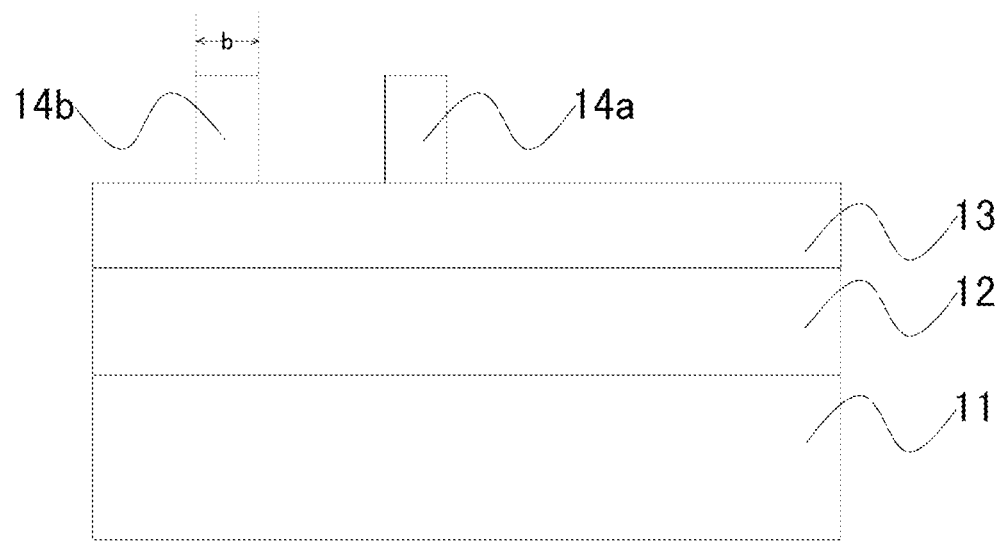
Figure 1E:
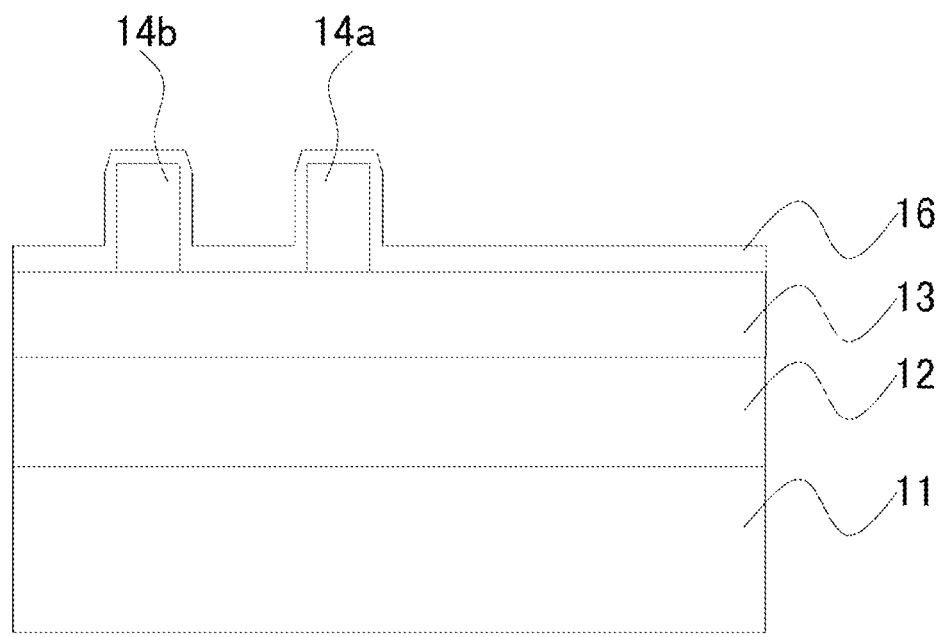
Figure 1F:
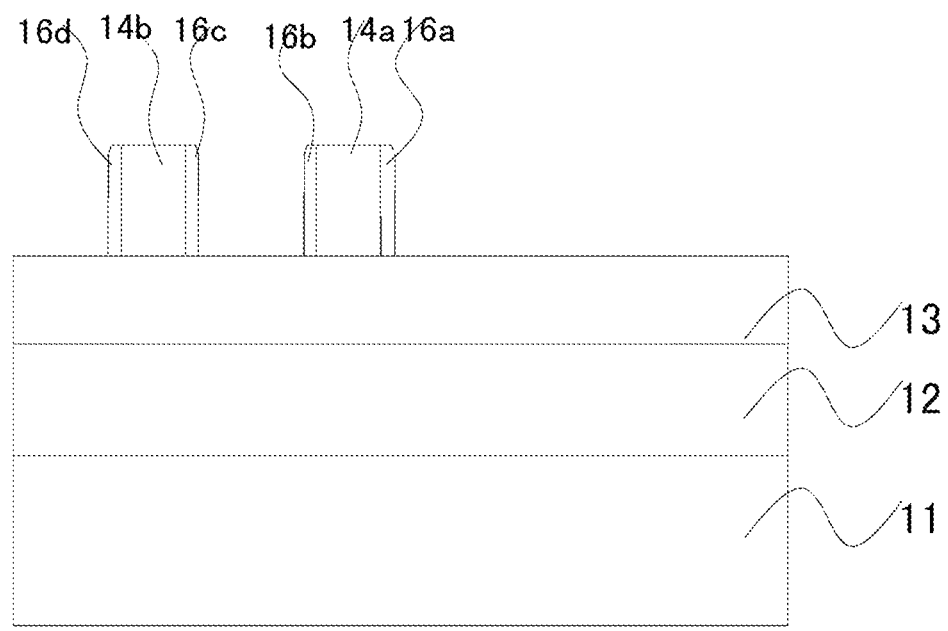
Figure 1G:
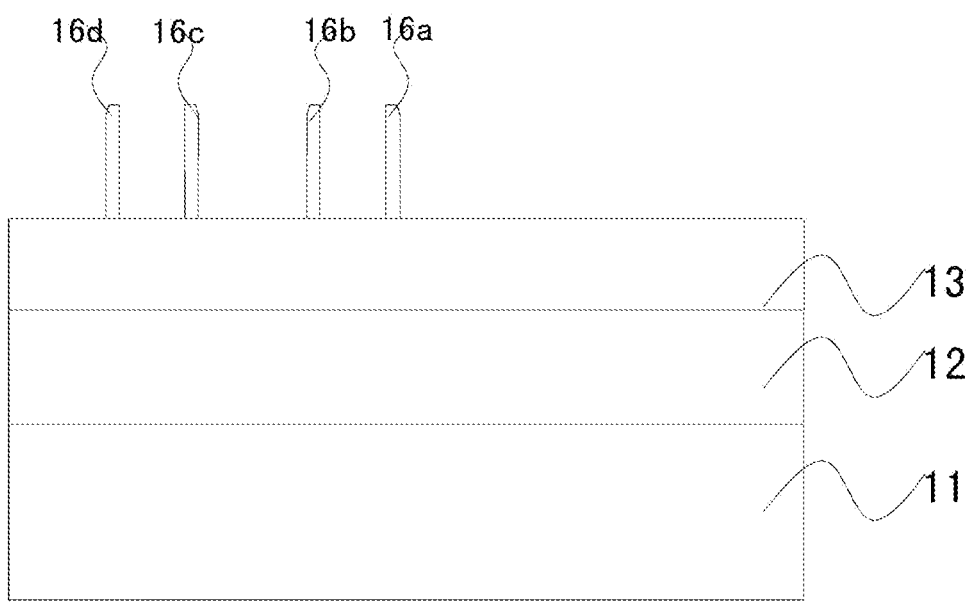
Figure 1H:
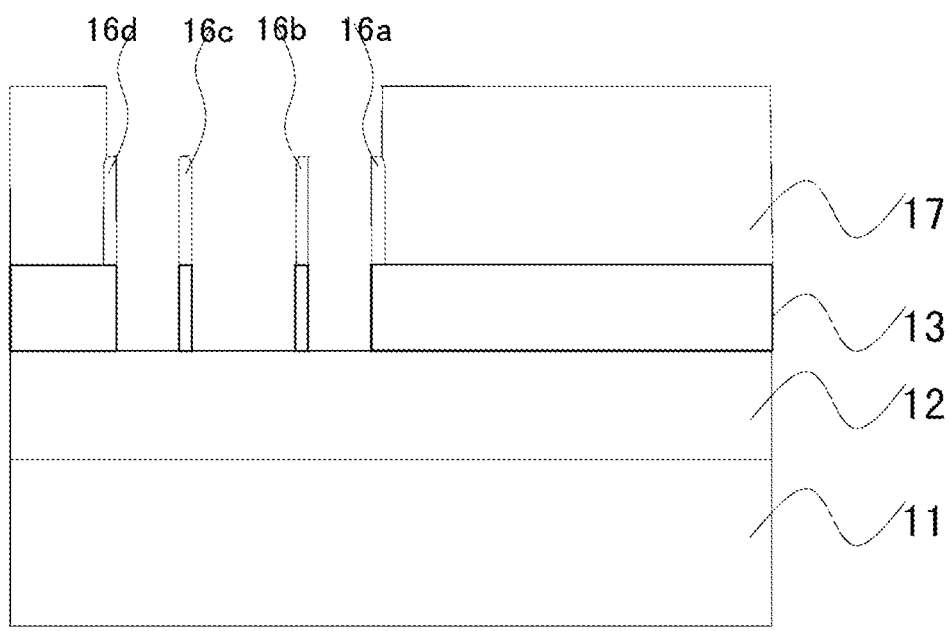
Figure 1I:
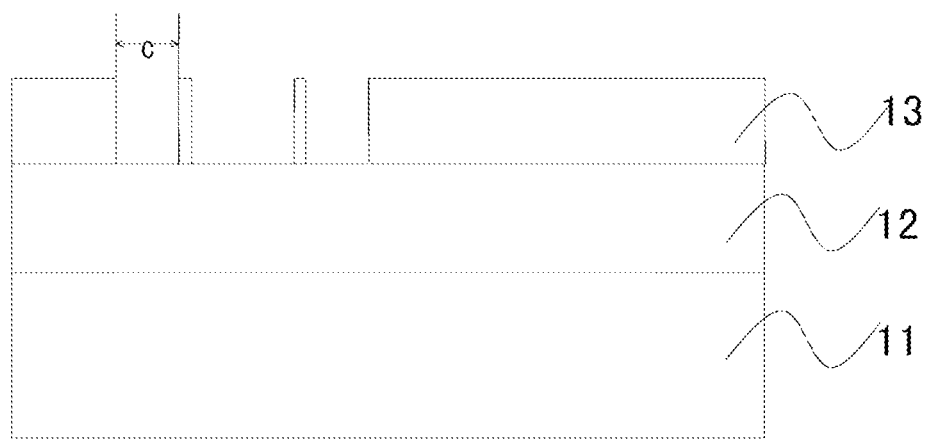
Figure 2:
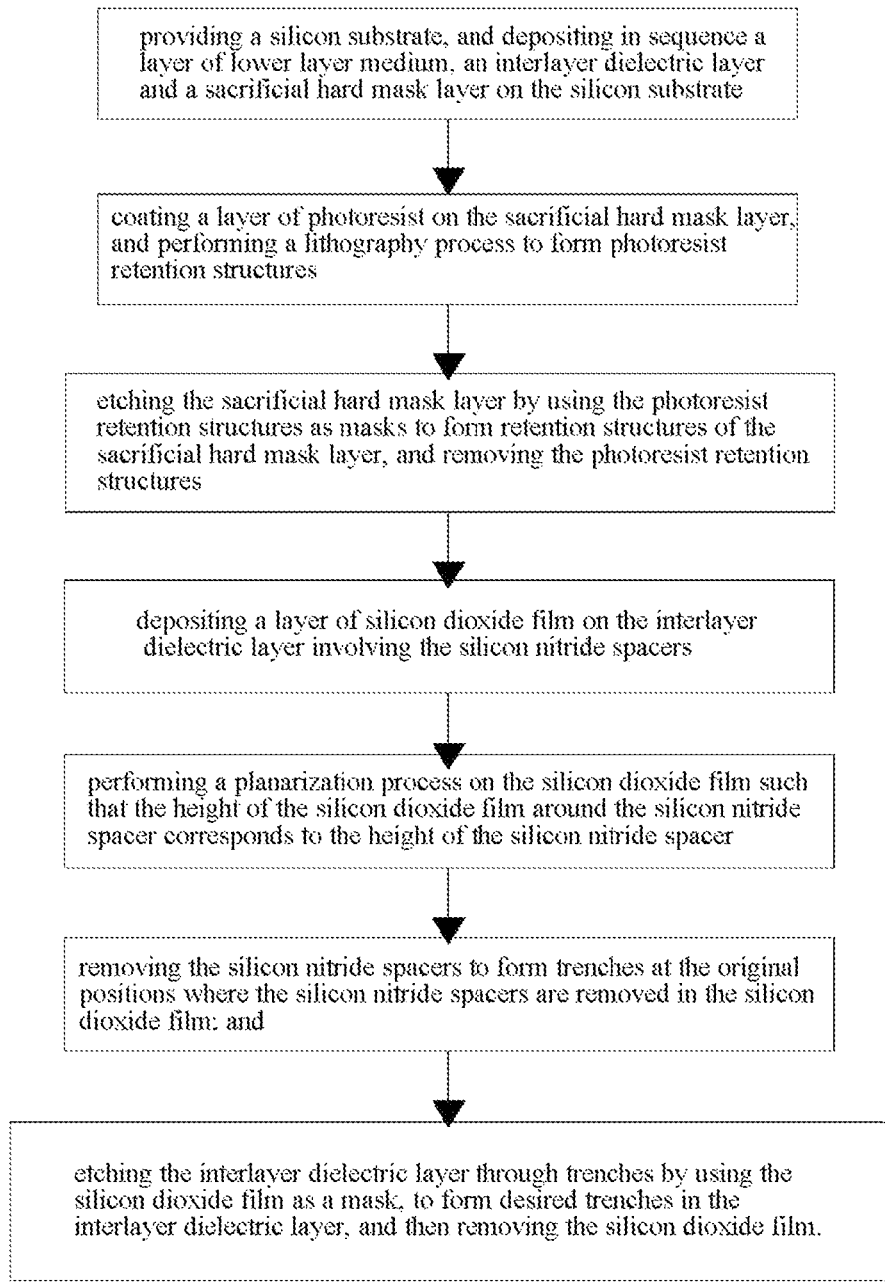
FIG. 2 is a flow chart illustrating a method for reducing a minimum line width in a spacer-defined double patterning process according to the present invention.
Figure 3A:
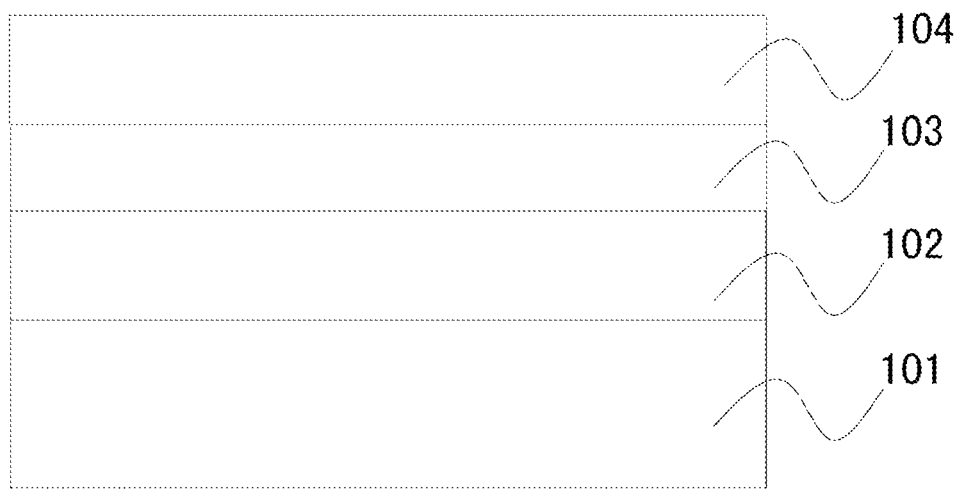
FIGS. 3A to 3I are diagrams of cross-section structure illustrating the method for reducing a minimum line width in a spacer-defined double patterning process shown in FIG. 2.
Figure 3B:
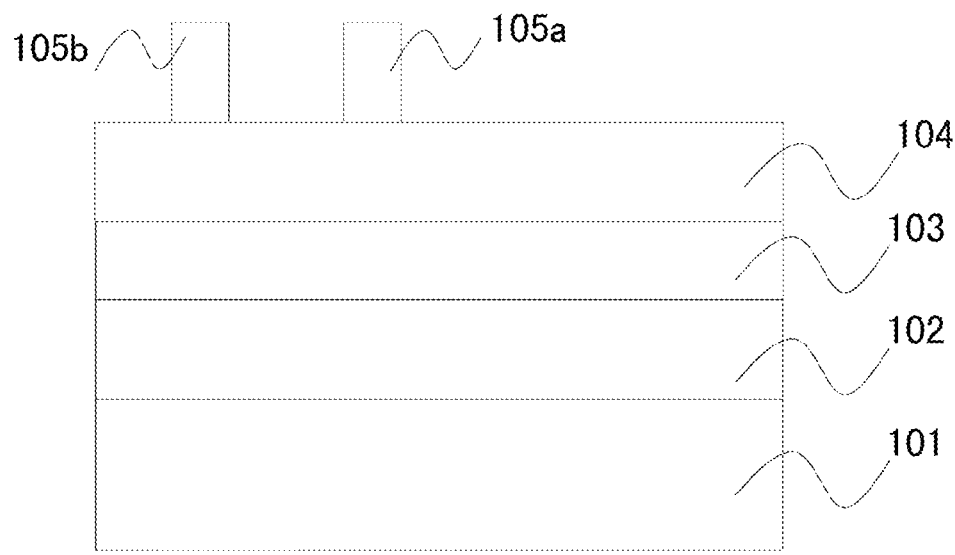
Figure 3C:
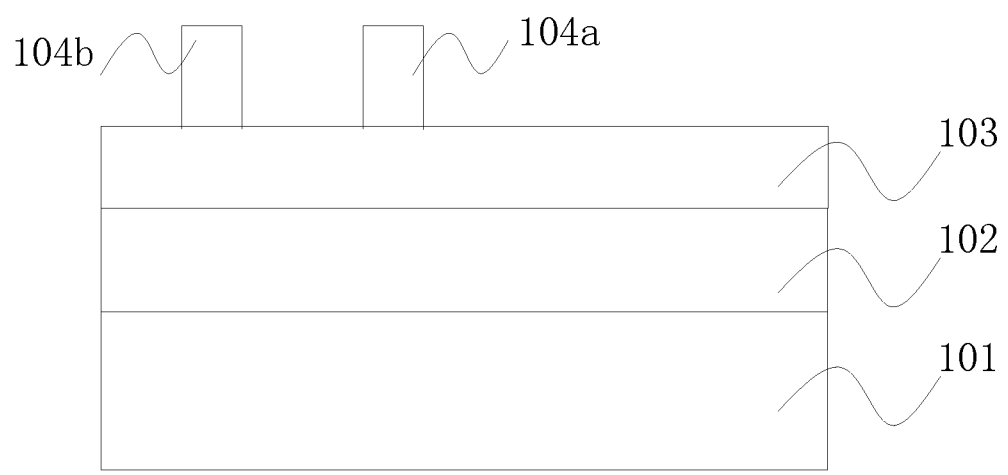
Figure 3D:
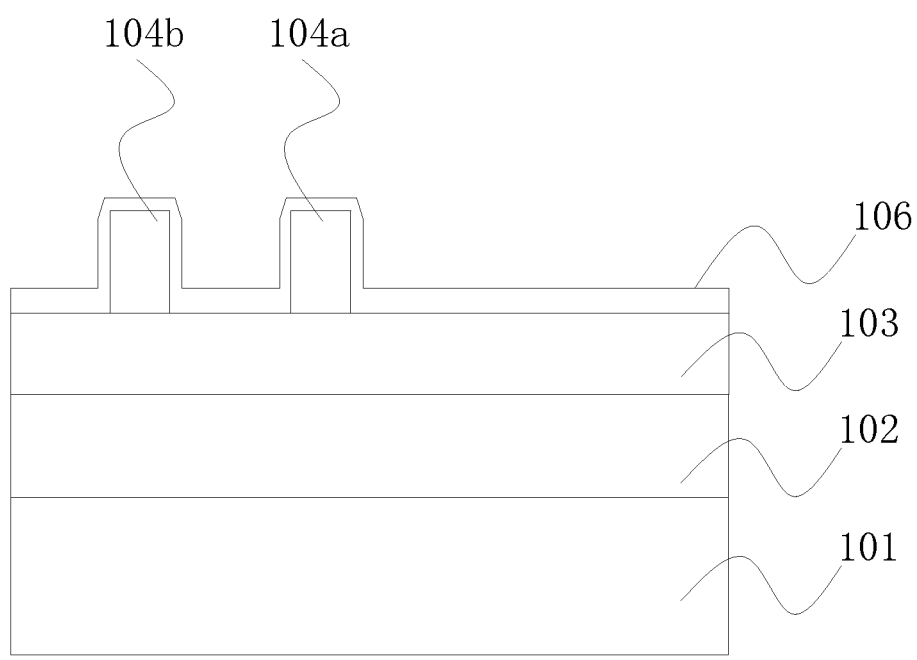
Figure 3E:
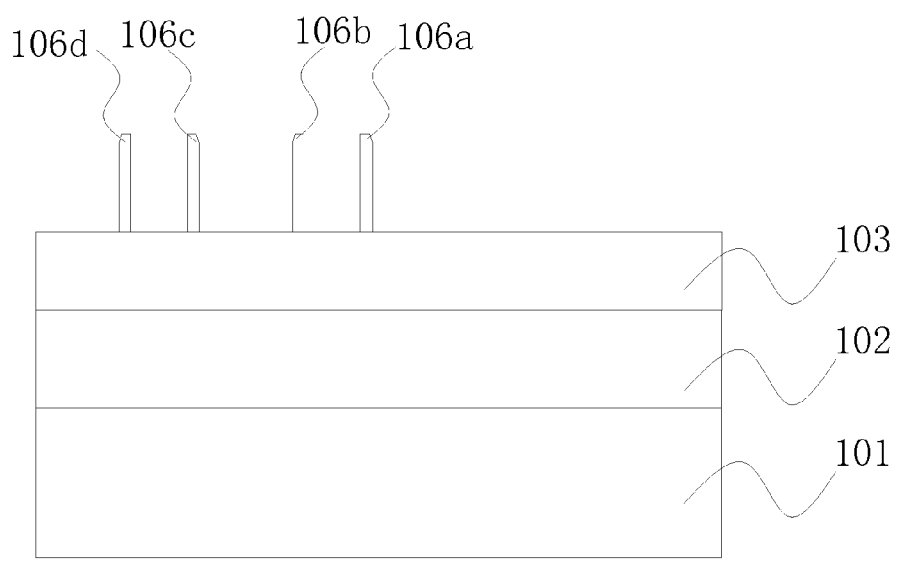
Figure 3F:
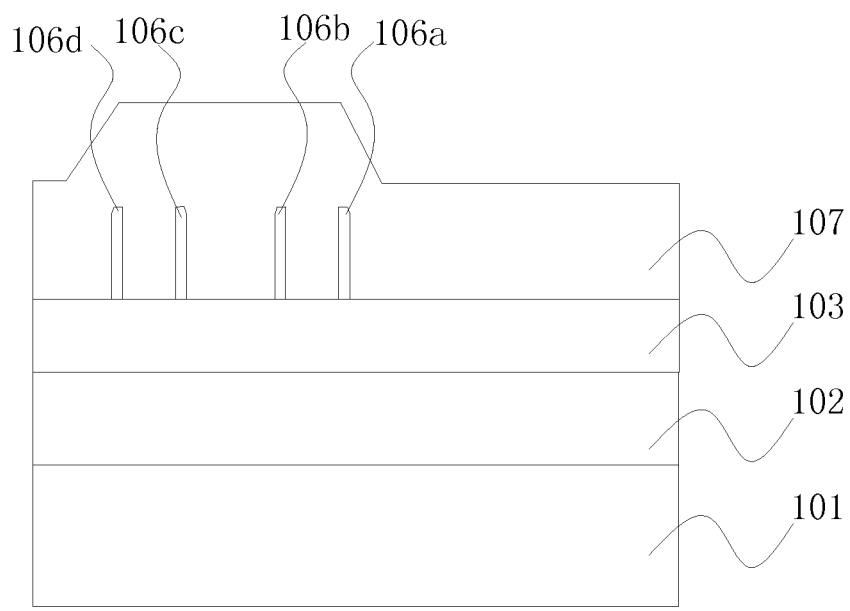
Figure 3G:
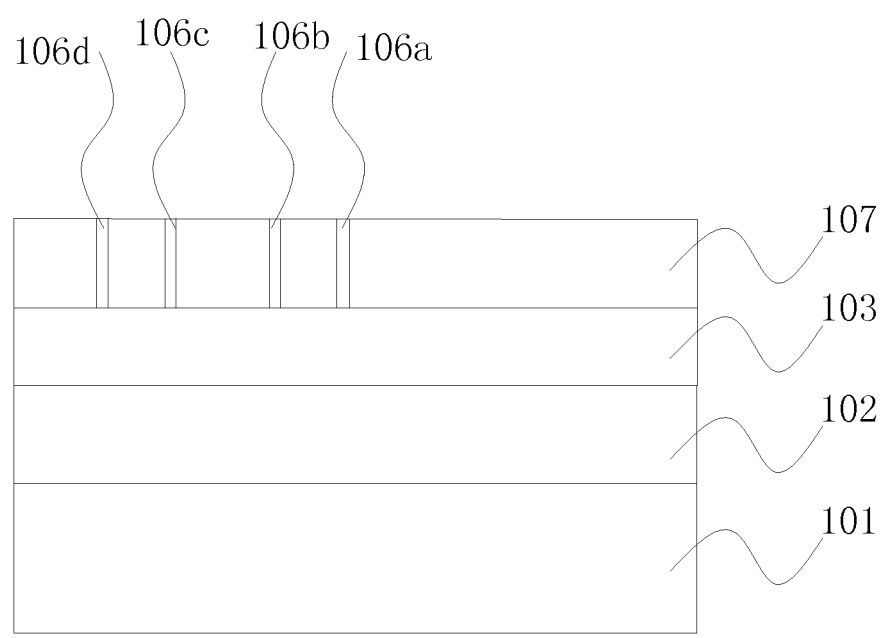
Figure 3H:
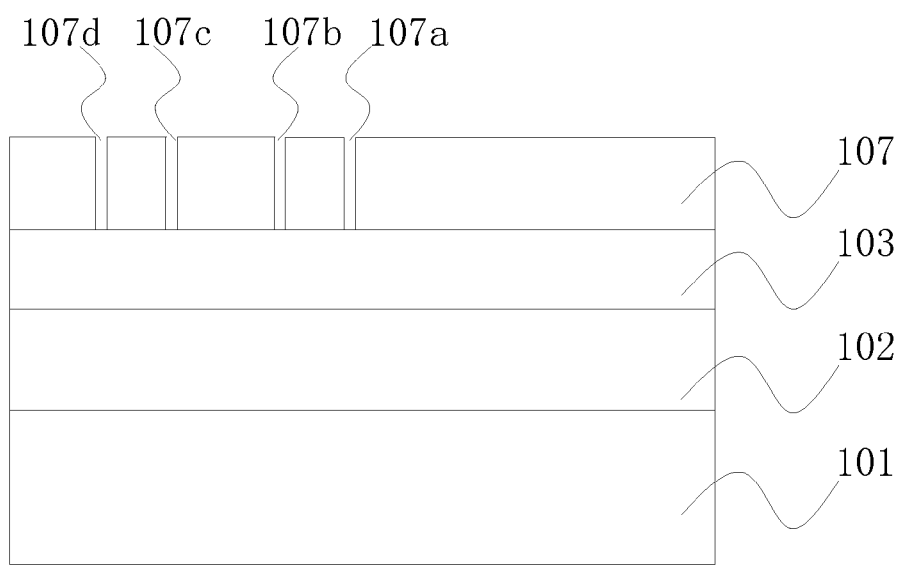
Figure 3I:
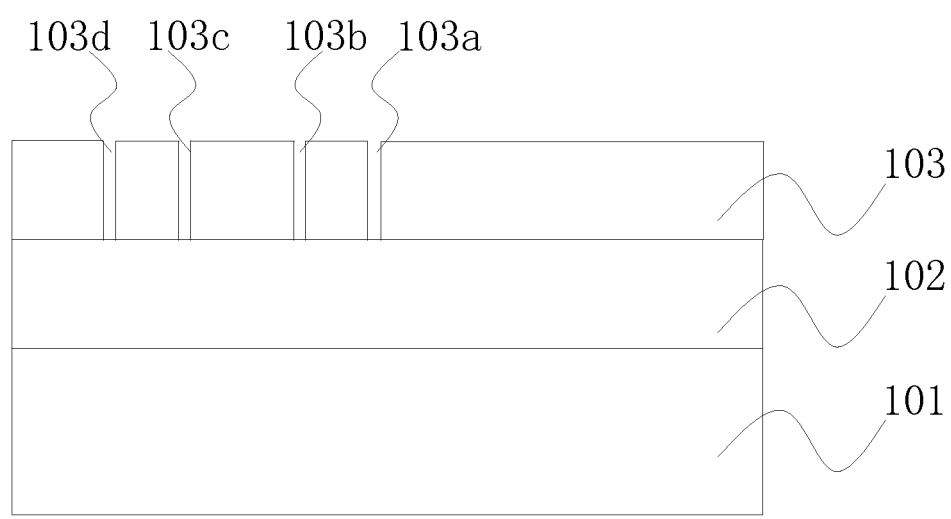

As shown in FIG. 2 and FIGS. 3A-3J, a method for reducing a minimum line width in a spacer-defined double patterning process of the invention (taking metal trenches as an example), comprises the following steps of:

step S1: providing a silicon substrate 101, and depositing a lower layer medium 102, an interlayer dielectric layer 103 and a sacrificial hard mask layer 104 in sequence on the silicon substrate 101 (as shown in FIG. 3A);

step S2: coating a layer of photoresist on the sacrificial hard mask layer 104, and performing a lithography process (including exposure and development processes) to form photoresist retention structures 105a, 105b (as shown in FIG. 3B);

step S3: etching the sacrificial hard mask layer 104 by using the photoresist retention structures 105a, 105b as masks to form retention structures 104a, 104b of the sacrificial hard mask layer, and removing the photoresist retention structures 105a, 105b (as shown in FIG. 3C);

step S4: depositing a layer of silicon nitride film 106 on the interlayer dielectric layer 103 and the retention structures 104a, 104b of the sacrificial hard mask layer (as shown in FIG. 3D), and etching the silicon nitride film 106 with a dry etching process to form silicon nitride spacers 106a, 106b, 106c and 106d on both sides of the sacrificial hard mask layer 104, and then removing the sacrificial hard mask layer 104; in this step, an anisotropic dry etching process may be used to etch the silicon nitride film 106 for forming silicon nitride spacers 106a, 106b, 106c and 106d on both sides of the sacrificial hard mask layer 104 (as shown in FIG. 3E).

step S5: depositing a layer of silicon dioxide film 107 on the interlayer dielectric layer 103 including the silicon nitride spacers 106a, 106b, 106c and 106d (as shown in FIG. 3F);

step S6: performing a planarization process on the silicon dioxide film 107 such that the height of the silicon dioxide film 107 around the silicon nitride spacers 106a, 106b, 106c and 106d corresponds to the heights of the silicon nitride spacers 106a, 106b, 106c and 106d; in this step, the planarization process on the silicon dioxide film 107 may be performed with a chemically mechanical polishing method (as shown in FIG. 3G);

step S7: removing the silicon nitride spacers 106a, 106b, 106c and 106d to form trenches 107a, 107b, 107c and 107d at the original positions, where the silicon nitride spacers 106a, 106b, 106c and 106d are removed, in the silicon dioxide film 107 (as shown in FIG. 3H); and step S8: etching the interlayer dielectric layer 103 through the trenches 107a, 107b, 107c and 107d by using the silicon dioxide film 107 as a mask to form desired trenches 103a, 103b, 103c and 103d in the interlayer dielectric layer 103, and removing the silicon dioxide film 107 (as shown in FIG. 3I).

It can be seen that the minimum line width of the trenches 103a, 103b, 103c and 103d formed in the embodiment is determined by the deposited thickness of the silicon nitride film 106, so that a smaller line width of the trench can be achieved by depositing a thinner silicon nitride film 106 with spacers depending on the practical requirements. In addition, a trench structure having a width less than 20 nm can be achieved by using the method when the deposited thickness of the silicon nitride film with spacers is 20 nm.

In sum, a method for reducing a minimum line width in the spacer-defined double patterning process according to the invention can convert the silicon nitride spacers into the trenches in the interlayer dielectric layer, by using the silicon dioxide film as a mask and by means of a chemically mechanical polishing (CMP) process and an etching process, such that the minimum line width of the trench is determined by the thickness of the silicon nitride film, and thus a smaller line width can be achieved and the process can be simple and easy to control.

It should be noted that, the disclosure set forth above is merely illustration of the specific embodiment of the present invention, in which the equipments and structures that are not described in details should be understood as implementing with common ways in the art; and the above-described embodiment cannot be construed as limitation to the implementing scope of the invention, that is to say, any equivalent variations and modifications to be made in accordance with the disclosure of the invention will fall within the protection scope of the invention.

What is claimed is:

1. A method for reducing a minimum line width in a spacer-defined double patterning process, comprising the following steps of:
    step S1: providing a silicon substrate, and depositing in sequence a layer of lower layer medium, an interlayer dielectric layer and a sacrificial hard mask layer on the silicon substrate;
    step S2: coating a layer of photoresist on the sacrificial hard mask layer, and performing a lithography process;
    step S3: etching the sacrificial hard mask layer by using the photoresist as a mask to form retention structures of the sacrificial hard mask layer, and removing the photoresist;
    step S4: depositing a layer of silicon nitride film on the interlayer dielectric layer and the retention structures of the sacrificial hard mask layer, etching the silicon nitride film with a dry etching process to form silicon nitride spacers on both sides of the retention structures of the sacrificial hard mask layer, and then removing the retention structures of the sacrificial hard mask layer;
    step S5: depositing a layer of silicon dioxide film on the interlayer dielectric layer and the silicon nitride spacers;
    step S6: performing a planarization process on the silicon dioxide film such that the height of the silicon dioxide film around the silicon nitride spacer corresponds to the height of the silicon nitride spacer;
    step S7: removing the silicon nitride spacers to form trenches at the positions where the silicon nitride spacers are removed in the silicon dioxide film; and
    step S8: etching the interlayer dielectric layer by using the silicon dioxide film as a mask and by means of the trenches in the silicon dioxide film, to form desired trenches in the interlayer dielectric layer, and then removing the silicon dioxide film,
    wherein the trenches are formed in the silicon dioxide film in step S7 only at positions where the silicon nitride spacers are removed, and
    wherein the trenches are formed in the interlayer dielectric layer in step S8 only where the trenches are formed in the silicon dioxide film.

2. The method in accordance with claim 1, wherein an anisotropic dry etching process is used to etch the silicon nitride film in said step S4.

3. The method in accordance with claim 1, wherein the planarization process on the silicon dioxide film in said step S6 is performed with a chemically mechanical polishing method.

4. The method in accordance with claim 1, wherein the width of the silicon nitride spacer in said step S4 is determined by the thickness of the silicon nitride film deposited.

5. The method in accordance with claim 1, wherein the minimum line width of the trench in said step S8 is determined by the width of the silicon nitride spacer formed in said step S4, and thus is determined by the thickness of the silicon nitride film deposited in said step S4.

6. A method for reducing a minimum line width in a spacer-defined double patterning process, comprising the following steps of:
    step S1: providing a silicon substrate, and depositing in sequence a layer of lower layer medium, an interlayer dielectric layer and a sacrificial hard mask layer on the silicon substrate;
    step S2: coating a layer of photoresist on the sacrificial hard mask layer, and performing a lithography process;
    step S3: etching the sacrificial hard mask layer by using the photoresist as a mask to form retention structures of the sacrificial hard mask layer, and removing the photoresist;
    step S4: depositing a layer of silicon nitride film on the interlayer dielectric layer and the retention structures of the sacrificial hard mask layer, etching the silicon nitride film with a dry etching process to form silicon nitride spacers on both sides of the retention structures of the sacrificial hard mask layer, and then removing the retention structures of the sacrificial hard mask layer;
    step S5: depositing a layer of silicon dioxide film on the interlayer dielectric layer and the silicon nitride spacers;
    step S6: performing a planarization process on the silicon dioxide film such that the height of the silicon dioxide film around the silicon nitride spacer corresponds to the height of the silicon nitride spacer;
    step S7: removing the silicon nitride spacers to form trenches at the positions where the silicon nitride spacers are removed in the silicon dioxide film; and
    step S8: etching the interlayer dielectric layer by using the silicon dioxide film as a mask and by means of the trenches in the silicon dioxide film, to form desired trenches in the interlayer dielectric layer, and then removing the silicon dioxide film, wherein the silicon dioxide film layer is planar following planarization step S6.

7. The method in accordance with claim 6, wherein an anisotropic dry etching process is used to etch the silicon nitride film in said step S4.

8. The method in accordance with claim 6, wherein the planarization process on the silicon dioxide film in said step S6 is performed with a chemically mechanical polishing method.

9. The method in accordance with claim 6, wherein the width of the silicon nitride spacer in said step S4 is determined by the thickness of the silicon nitride film deposited.

10. The method in accordance with claim 6, wherein the minimum line width of the trench in said step S8 is determined by the width of the silicon nitride spacer formed in said step S4, and thus is determined by the thickness of the silicon nitride film deposited in said step S4.

* * * * *